United States Patent
Chang et al.

(10) Patent No.: US 8,048,723 B2
(45) Date of Patent: Nov. 1, 2011

(54) GERMANIUM FINFETS HAVING DIELECTRIC PUNCH-THROUGH STOPPERS

(75) Inventors: Cheng-Hung Chang, Hsin-Chu (TW); Yu-Rung Hsu, Tainan (TW); Chen-Yi Lee, Keelung (TW); Shih-Ting Hung, Sanchong (TW); Chen-Nan Yeh, Hsi-Chih (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 298 days.

(21) Appl. No.: 12/329,279

(22) Filed: Dec. 5, 2008

(65) Prior Publication Data

US 2010/0144121 A1    Jun. 10, 2010

(51) Int. Cl.
*H01L 21/332* (2006.01)
(52) U.S. Cl. .................... 438/135; 257/192; 257/E21.19
(58) Field of Classification Search .................... 438/176
See application file for complete search history.

(56) References Cited

U.S. PATENT DOCUMENTS

| | | | |
|---|---|---|---|
| 6,706,571 B1 | 3/2004 | Yu et al. |
| 6,858,478 B2 | 2/2005 | Chau et al. |
| 6,909,147 B2 | 6/2005 | Aller et al. |
| 7,180,134 B2 | 2/2007 | Yang et al. |
| 7,190,050 B2 | 3/2007 | King et al. |
| 7,208,796 B2 | 4/2007 | Chang et al. |
| 7,247,887 B2 | 7/2007 | King et al. |
| 7,265,008 B2 | 9/2007 | King et al. |
| 7,297,600 B2 | 11/2007 | Oh et al. |
| 7,320,908 B2 | 1/2008 | Son et al. |
| 7,332,386 B2 | 2/2008 | Lee et al. |
| 7,396,726 B2 | 7/2008 | Oh et al. |
| 7,508,031 B2 | 3/2009 | Liu et al. |
| 7,528,465 B2 | 5/2009 | King et al. |
| 7,544,994 B2 | 6/2009 | Schepis et al. |
| 7,605,449 B2 | 10/2009 | Liu et al. |
| 7,638,843 B2 | 12/2009 | Xiong et al. |
| 7,683,417 B2 | 3/2010 | Xiong et al. |
| 7,745,871 B2 | 6/2010 | Oh et al. |
| 7,781,273 B2 | 8/2010 | Schepis et al. |
| 2004/0256683 A1 | 12/2004 | Lee et al. |

(Continued)

FOREIGN PATENT DOCUMENTS

CN    1681103 A    10/2005

(Continued)

OTHER PUBLICATIONS

S. Balakumar (Fabrication of Thick Germanium-on-Insulator (FeOI) Substrate) (Publish online Apr. 4, 2008).*

(Continued)

*Primary Examiner* — Brook Kebede
*Assistant Examiner* — Tony Tran
(74) *Attorney, Agent, or Firm* — Slater & Matsil, L.L.P.

(57) ABSTRACT

A method of forming a semiconductor structure includes providing a composite substrate, which includes a bulk silicon substrate and a silicon germanium (SiGe) layer over and adjoining the bulk silicon substrate. A first condensation is performed to the SiGe layer to form a condensed SiGe layer, so that the condensed SiGe layer has a substantially uniform germanium concentration. The condensed SiGe layer and a top portion of the bulk silicon substrate are etched to form a composite fin including a silicon fin and a condensed SiGe fin over the silicon fine. The method further includes oxidizing a portion of the silicon fin; and performing a second condensation to the condensed SiGe fin.

17 Claims, 13 Drawing Sheets

U.S. PATENT DOCUMENTS

| | | |
|---|---|---|
| 2005/0077553 A1 | 4/2005 | Kim et al. |
| 2005/0153490 A1 | 7/2005 | Yoon et al. |
| 2005/0199919 A1 | 9/2005 | Liu et al. |
| 2005/0269629 A1 | 12/2005 | Lee et al. |
| 2005/0272190 A1 | 12/2005 | Lee et al. |
| 2005/0272192 A1 | 12/2005 | Oh et al. |
| 2006/0076625 A1 | 4/2006 | Lee et al. |
| 2006/0170053 A1 | 8/2006 | Yeo et al. |
| 2007/0045748 A1 | 3/2007 | Booth, Jr. et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0221956 A1 | 9/2007 | Inaba |
| 2008/0001171 A1* | 1/2008 | Tezuka et al. ............ 257/191 |
| 2008/0006908 A1 | 1/2008 | Lin et al. |
| 2008/0029828 A1 | 2/2008 | Oh et al. |
| 2008/0048265 A1 | 2/2008 | Booth, Jr. et al. |
| 2008/0050866 A1 | 2/2008 | Booth, Jr. et al. |
| 2008/0050918 A1* | 2/2008 | Damlencourt ............ 438/694 |
| 2008/0061370 A1 | 3/2008 | Matsuo |
| 2008/0122013 A1 | 5/2008 | Schepis et al. |
| 2008/0157225 A1 | 7/2008 | Datta et al. |
| 2008/0224258 A1 | 9/2008 | Schepis et al. |
| 2008/0230852 A1 | 9/2008 | Yu et al. |
| 2008/0237641 A1 | 10/2008 | Oh et al. |
| 2008/0265338 A1 | 10/2008 | Yu et al. |
| 2008/0290470 A1 | 11/2008 | King et al. |
| 2008/0296632 A1 | 12/2008 | Moroz et al. |
| 2009/0057846 A1 | 3/2009 | Doyle et al. |
| 2009/0108316 A1 | 4/2009 | Xiong et al. |
| 2009/0159972 A1 | 6/2009 | Jakschik et al. |
| 2009/0181477 A1 | 7/2009 | King et al. |
| 2009/0206446 A1 | 8/2009 | Russ et al. |
| 2009/0278196 A1 | 11/2009 | Chang et al. |
| 2010/0002494 A1 | 1/2010 | Xiong et al. |
| 2010/0025740 A1 | 2/2010 | Lee |
| 2010/0035398 A1 | 2/2010 | Oh et al. |
| 2010/0044784 A1 | 2/2010 | Oh et al. |
| 2010/0163971 A1 | 7/2010 | Hung et al. |
| 2010/0187656 A1 | 7/2010 | Ke et al. |
| 2010/0213548 A1 | 8/2010 | Chang et al. |

FOREIGN PATENT DOCUMENTS

| | | |
|---|---|---|
| CN | 1921116 A | 2/2007 |
| CN | 101097954 A | 1/2008 |

OTHER PUBLICATIONS

Tezuka et al. "A Novel Fabrication Technique of Ultrathin and Relaxed SiGe Buffer Layers with High Ge Fraction for Sub-100nm Strained Silicon-on-Insulator MOSFETs."*

Balakumar et al. "Fabrication of high Ge content SiGe layer on Si by Ge condensation technique."*

Hisamoto, D., e al., "A Fully Depleted Lean-Channel Transistor (DELTA)—A Novel Vertical Ultra Thin SOI MOSFET—," International Electron Devices Meeting, 1989, pp. 833-836.

Kanemura, T., et al., "Improvement of Drive Current in Bulk-FinFET Using Full 3D Process/Device Simulations," International Conference on Simulation of Semiconductor Processes and Devices (SISPAD), 2006, pp. 131-134.

Liow, T.-Y., et al., "Investigation of Silicon-Germanium Fins Fabricated Using Germanium Condensation on Vertical Compliant Structures," Applied Physics Letters, vol. 87, 2005, pp. 262104-1-262104-3.

Okano, K., et al., "Process Integration Technology and Device Characteristics of CMOS FinFET on Bulk Silicon Substrate with sub-10 nm Fin Width and 20 nm Gate Length," International Electron Devices Meeting, 2005, 4 pages.

Takagi, S., et al., "Carrier-Transport-Enhanced Channel CMOS for Improved Power Consumption and Performance," IEEE Transactions on Electron Devices, vol. 55, No. 1, Jan. 2008, pp. 21-39.

Balakumar, S., et al., "Fabrication of Thick Germanium-on-Insulator (GeOI) Substrates," Journal of Electronic Materials, vol. 37, No. 7, 2008, pp. 944-950.

* cited by examiner

GERMANIUM FINFETS HAVING DIELECTRIC PUNCH-THROUGH STOPPERS

CROSS-REFERENCE TO RELATED APPLICATION

This application relates to commonly assigned U.S. patent application Ser. No. 12/116,074, filed May 6, 2008, and entitled "FinFETs Having Dielectric Punch-Through Stoppers," which application is incorporated herein by reference.

TECHNICAL FIELD

This invention relates generally to semiconductor devices, and particularly to structures and formation methods of germanium nano-wires and Fin field-effect transistors (Fin-FETs) having germanium fins.

BACKGROUND

Germanium is a commonly known semiconductor material. The electron mobility and hole mobility of germanium are greater than that of silicon, hence making germanium an excellent material in the formation of integrated circuits. However, in the past, silicon gained more popularity since its oxide (silicon oxide) is readily usable in the gate dielectric of metal-oxide-semiconductor (MOS) transistors. The gate dielectrics of the MOS transistors can be conveniently formed by thermal oxidation of silicon substrates. The oxide of germanium, on the other hand, is soluble in water, and hence is not suitable for the formation of gate dielectrics.

With the use of high-k dielectric materials in the gate dielectrics of MOS transistors, the convenience provided by the silicon oxide is no longer a big advantage, and hence germanium is reexamined for use in integrated circuits. Recent studies of germanium focusing on germanium nano-wires, which are used in Fin field-effect transistors (Fin-FETs), have been reported.

A challenge faced by the semiconductor industry is that to reduce the leakage of MOS transistors and to increase the drive currents of germanium FinFETs, germanium-on-insulator (GOI) structures need to be formed. However, the price of GOI substrates (and strained GOI (SGOI) substrates) is many times higher than that of silicon substrates, and it is not practical for foundries to buy GOI substrates or SGOI substrates.

Methods for forming germanium layers on bulk silicon have also been explored. For example, methods for forming germanium layers or nano-wires on bulk silicon using two-dimensional (2D) or three-dimensional (3D) condensations have been reported. There are two ways of forming germanium layers. One way is to form a silicon germanium layer on a bulk silicon substrate. This method incurs a lower cost. However, since 2D and 3D condensations require high temperatures, for example, 1000° C. or above, to incur the move of silicon to the surface of the silicon germanium layer, germanium atoms will penetrate into the bulk silicon substrate. As a result, the germanium concentration in the bulk silicon substrate is graded, and pure germanium layers cannot be formed.

On the other hand, if the 2D and/or 3D condensations are started from a substrate including a silicon germanium (SiGe) layer on a buried oxide layer (BOX), which is further on a silicon substrate, the downward movement of germanium may be blocked by the BOX, and substantially pure germanium nano-wires can be formed. However, the substrate having the SiGe/BOX/silicon structure is very expensive, and hence this method is still not practical in the mass production of integrated circuits.

What are needed in the art, therefore, are formation methods and structures thereof that incorporate germanium to take advantage of the benefits associated with the high electron mobility and hole mobility while at the same time not incurring the high cost.

SUMMARY OF THE INVENTION

In accordance with one aspect of the present invention, a method of forming a semiconductor structure includes providing a composite substrate, which includes a bulk silicon substrate, and a silicon germanium (SiGe) layer over and adjoining the bulk silicon substrate. A first condensation is performed to the SiGe layer to form a condensed SiGe layer, so that the condensed SiGe layer has a substantially uniform germanium concentration. The condensed SiGe layer and a top portion of the silicon substrate are etched to form a composite fin including a silicon fin and a condensed SiGe fin over the silicon fin. The method further includes oxidizing a portion of the silicon fin; and performing a second condensation to the condensed SiGe fin.

In accordance with another aspect of the present invention, a method of forming a semiconductor structure includes providing a bulk silicon substrate; epitaxially growing a silicon germanium (SiGe) layer on the bulk silicon substrate; and performing a first condensation to the SiGe layer to form a condensed SiGe layer at a temperature between about 825° C. and about 880° C.

In accordance with yet another aspect of the present invention, a method of forming a semiconductor structure includes providing a bulk silicon substrate; and epitaxially growing a SiGe layer on the bulk silicon substrate. A first condensation is performed to the SiGe layer to form a condensed SiGe layer, wherein the first condensation is performed at an elevated temperature. The condensed SiGe layer and a top portion of the bulk silicon substrate are etched to form a recess and a composite fin in the recess, wherein the composite fin includes a silicon fin and a condensed SiGe fin over the silicon fin. The method further includes filling a first dielectric material into the recess; etching the first dielectric material until the condensed SiGe fin is exposed; forming a mask to cover a top surface and sidewalls of the condensed SiGe fin; recessing the first dielectric material to expose sidewalls of a portion of the silicon fin; oxidizing the portion of the silicon fin to form an insulator; and filling a second dielectric material on the first dielectric material. A top surface of the second dielectric material is substantially leveled to a top surface of the insulator. A second condensation is performed to the condensed SiGe fin to form a substantially pure germanium fin.

In accordance with yet another aspect of the present invention, a semiconductor structure includes a semiconductor substrate; a germanium fin over the semiconductor substrate; and an insulator. The insulator includes a first portion directly underlying and adjoining the germanium fin, the first portion having a first bottom surface; and a second portion adjoining the first portion. The second portion is not directly underlying the germanium fin. The second portion has a second bottom surface un-leveled with the first bottom surface.

In accordance with yet another aspect of the present invention, a semiconductor structure includes a silicon substrate having a top surface; a silicon fin over and adjoining the silicon substrate; and an insulator over and adjoining the top surface of the semiconductor substrate and the silicon fin. The insulator includes first portions on opposite sides of, and adjoining, the silicon fin; and a second portion over and adjoining the silicon fin. The semiconductor structure further includes a germanium fin over and adjoining the second portion of the insulator.

The advantageous features of the present invention include reduced punch-through currents in FinFETs, improved carrier mobility in the channels of the FinFETs, and a low production cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

An integrated circuit formation process including the formation of a germanium fin that may be used to form a fin field-effect transistor (FinFET, also referred to as a multi-gate transistor) is provided. The intermediate stages of manufacturing a preferred embodiment of the present invention are illustrated. The variations of the preferred embodiments are discussed. Throughout the various views and illustrative embodiments of the present invention, like reference numbers are used to designate like elements.

Embodiments of the invention relate to semiconductor structures and fabricating methods by forming a silicon germanium layer over a substrate. The SiGe layer can be condensed to provide a condensed SiGe layer that has a substantially uniform germanium concentration. The condensed SiGe layer can be provided to form a germanium fin for a FinFET.

Figure 1:
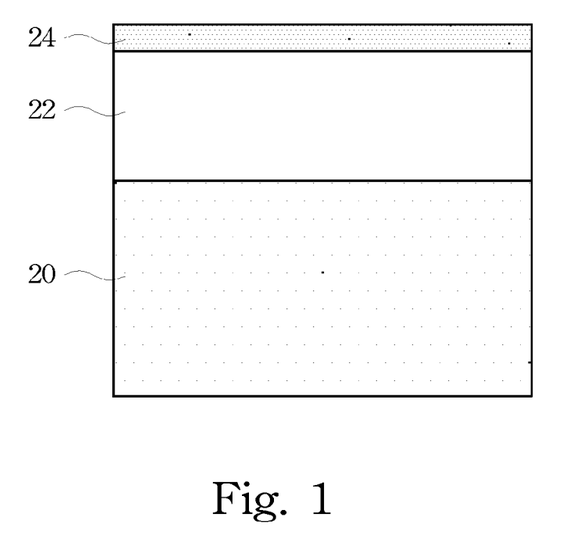
FIGS. 1, 2 and 4-20 are cross-sectional views of intermediate stages in the manufacturing of a first embodiment of the present invention, which includes the formation of a germanium fin.

Referring to FIG. 1, semiconductor substrate 20 is provided. In the preferred embodiment, semiconductor substrate 20 is a bulk silicon substrate (and hence may be referred to as silicon substrate 20 hereinafter), although other semiconductor materials may also be used. In alternative embodiments, semiconductor substrate 20 has a composite structure with more than one layer including a silicon layer on top. Silicon germanium (SiGe) layer 22 is formed on silicon substrate 20, for example, through an epitaxial growth. SiGe layer 22 may be expressed as $Si_{1-x}Ge_x$, wherein x is the atomic percentage of germanium. In the preferred embodiment, x is between about 0.15 and about 0.45. More preferably, x is about 0.25, or 25 percent.

Optionally, thin cap layer 24, which may be a silicon oxide, is formed on SiGe layer 22. Cap layer 24 may have a thickness between about 1 nm and about 10 nm. It is noted, however, that the dimensions recited throughout the description are merely examples, and may change if the integrated circuits are formed using different technologies. Cap layer 24 has the advantageous feature of preventing the oxidation of germanium in the subsequent condensation step.

Figure 2:
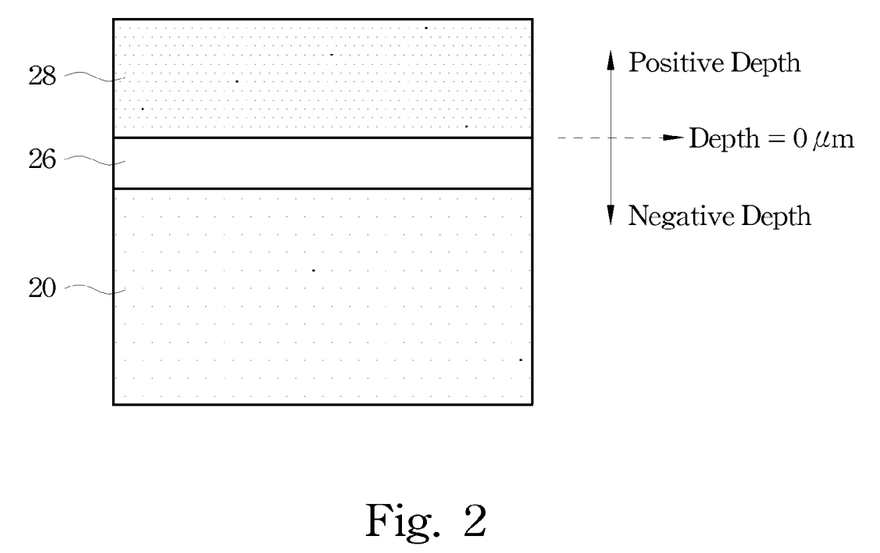

Next, as shown in FIG. 2, a two-dimensional (2D) condensation is performed, resulting in the condensed SiGe layer 26, and silicon oxide layer 28 on condensed SiGe layer 26. For simplicity, cap layer 24 is not shown since it may be formed of a similar material as, and hence may be merged with, silicon oxide layer 28. The 2D condensation is preferably performed in an oxygen-containing environment comprising, for example, $O_2$, with the preferred temperature between about 825° C. and about 880° C., and more preferably between about 835° C. and about 875° C., and even more preferably about 850° C. During the 2D condensation, the silicon atoms in SiGe layer 22 move upwardly, and react with oxygen to form silicon oxide layer 28. As the time of the 2D condensation progresses, the thickness of silicon oxide layer 28 increases. Meanwhile, with the number of silicon atoms in SiGe layer 22 reduced due to the oxidation, the germanium atoms in SiGe layer 26 are condensed, with the atomic percentage of germanium in SiGe layer 26 increasing over time.

Figure 3:
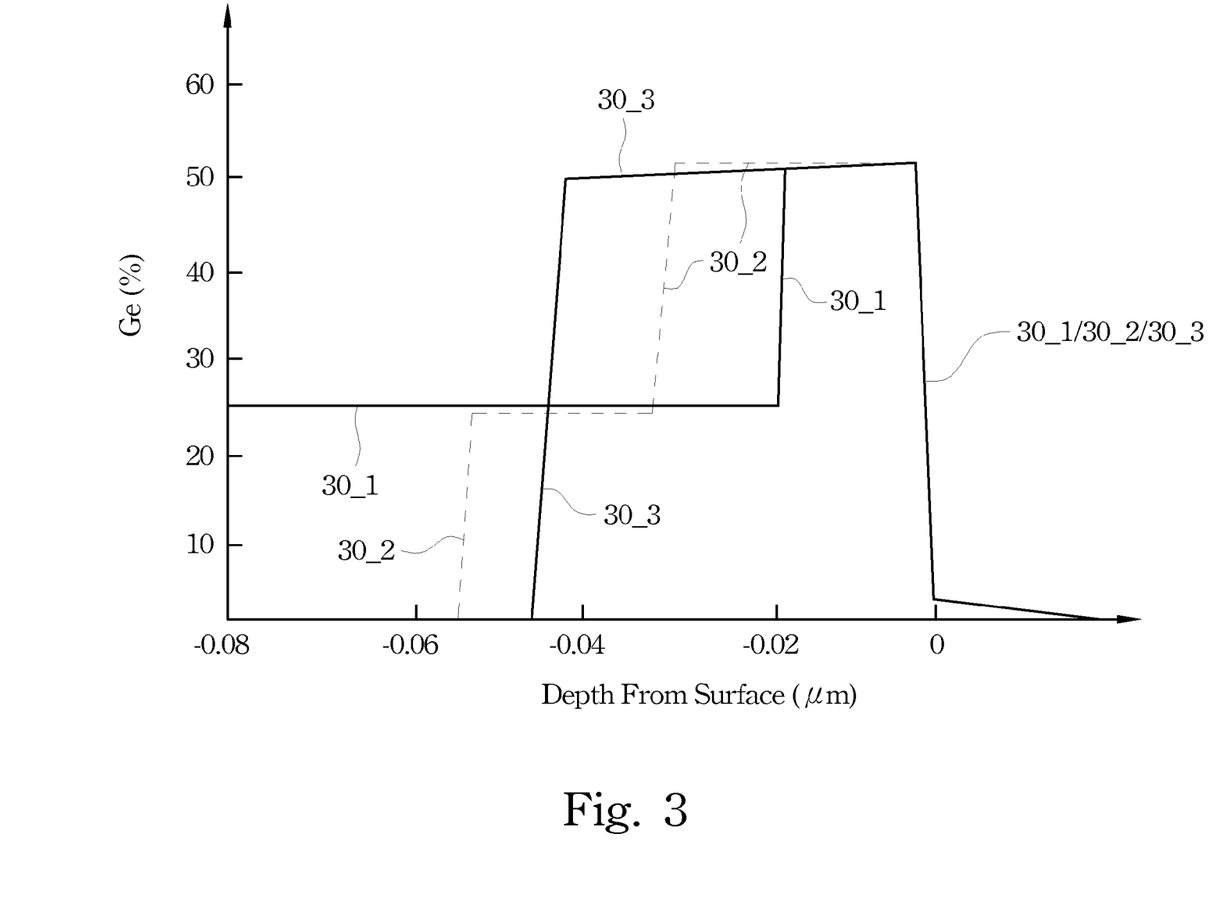
FIG. 3 schematically illustrates the germanium atomic percentages in the bulk silicon substrate, the silicon germanium layer, and the overlying silicon oxide layer.

The experiments performed by the inventors of the present invention demonstrated unexpected results, as schematically illustrated in FIG. 3. Conventional teachings were that due to the thermal effect in the 2D condensation, germanium atoms in SiGe layer 22 will diffuse downwardly into silicon substrate 20. A graded profile of germanium was thus expected to be formed in silicon substrate 20, with the germanium concentration in regions of silicon substrate 20 closer to SiGe layer 22 being greater than the germanium concentration in regions of silicon substrate 20 farther away from SiGe layer 22. However, the experiments illustrated that in a specific temperature range, namely about 825° C. to about 880° C., such effect is not observed. FIG. 3 illustrates the germanium concentration as a function of the depth measuring from the surface of SiGe layer 26 (the interface between SiGe layer 26 and silicon oxide layer 28, marked with depth being zero μm). The meaning of the positive and negative depths may be found in FIG. 2. It is observed that in the above-specified range of temperature, germanium atoms have very small or substantially no downward movement. As a result, germanium atoms are condensed to a substantially uniform atomic percentage, for example, about 50 percent. Underlying the condensed layer of SiGe with 50 percent germanium, a sharp transition occurs, and the atomic percentage of germanium is reduced rapidly (in a small transition region) to about 25 percent, which is the original germanium percentage in SiGe layer 22 (refer to FIG. 1). This proves that very little downward germanium diffusion occurred. Otherwise, a graded germanium profile would have been observed. Further, such a condensation without the downward movement of germanium occurs even when the condensation time is very long, for example, for nine hours or even longer. In addition, at the interface of silicon substrate 20 and SiGe layer 22, there is also no substantial downward movement of germanium atoms observed.

In the beginning of the 2D condensation, a portion of SiGe layer 22 is condensed to form condensed SiGe layer 26, as is shown by line 30_1 in FIG. 3, while other portions remain un-condensed. When the time of the 2D condensation increases, the thicknesses of the condensed SiGe layer 26 and silicon oxide layer 28 increase, while the thickness of the remaining portion of non-condensed SiGe layer 22 reduces, as shown by line 30_2 in FIG. 3. Please note that since the level with (depth=0 μm) in FIG. 3 is at the interface of SiGe layer 22 and the condensed SiGe layer 26, over time, the level with (depth=0 μm) in FIG. 3 moves down, and the combined thickness of SiGe layer 22 and condensed SiGe layer 26 decreases. If the time of the 2D condensation is long enough, for example, after about nine hours, an entirety of the non-condensed SiGe layer 22 is converted into condensed SiGe layer 26, as shown by line 30_3 in FIG. 3. Preferably, after the 2D condensation, an entirety of the non-condensed SiGe layer 22 is converted into the condensed SiGe layer 26, with no non-condensed SiGe layer 22 remaining. In alternative embodiments, after the 2D condensation, the remaining structure includes condensed SiGe layer 26, and the non-condensed SiGe layer 22 underlying condensed SiGe layer 26.

Figure 4:
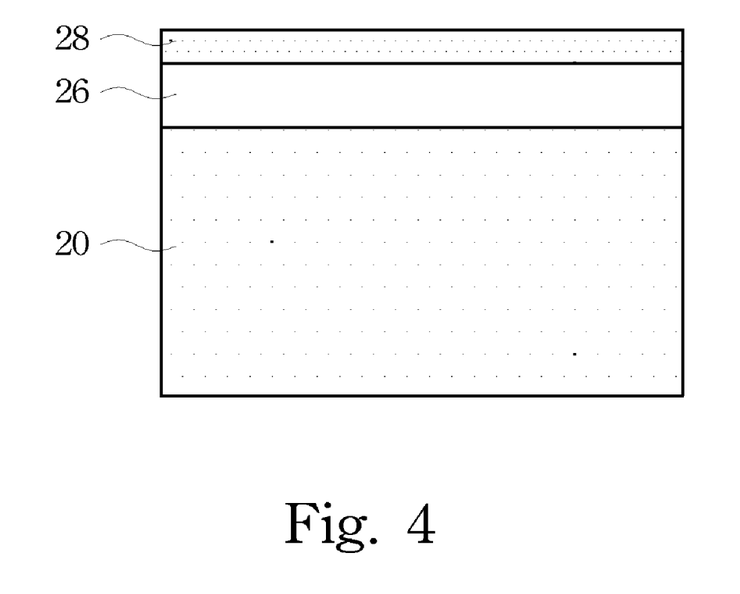
Figure 5:
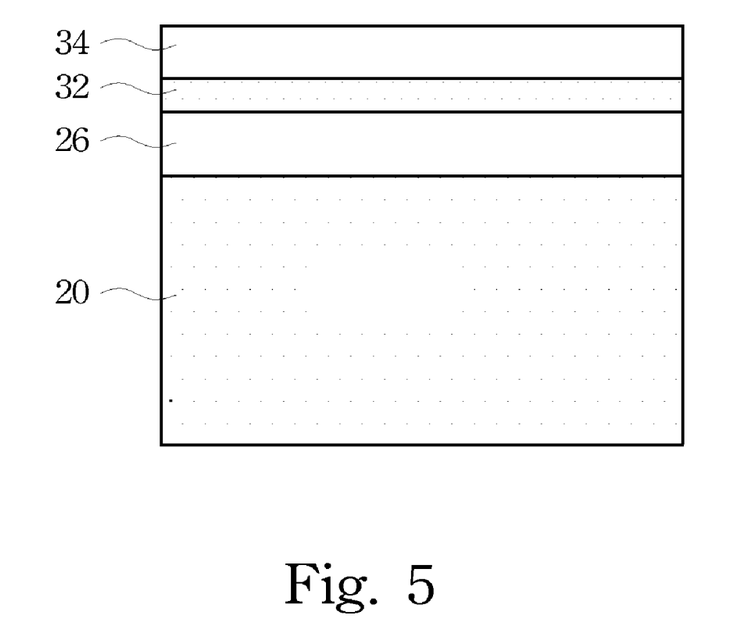

Referring to FIG. 4, silicon oxide layer 28 is thinned to form pad layer 32 (see FIG. 5). Alternative, silicon oxide layer 28 may be fully removed, followed by the re-deposition of pad layer 32. Pad layer 32 may act as an etch stop layer for etching the subsequently formed mask layer 34. In FIG. 5, mask layer 34 is formed on pad layer 32. In the preferred embodiment, mask layer 34 is formed of silicon nitride using low-pressure chemical vapor deposition (LPCVD). In other embodiments, mask layer 34 is formed by thermal nitridation of silicon, plasma enhanced chemical vapor deposition (PECVD), or plasma anodic nitridation using nitrogen-hydrogen. Mask layer 34 may have a thickness of about 60 nm to about 120 nm.

Figure 6:
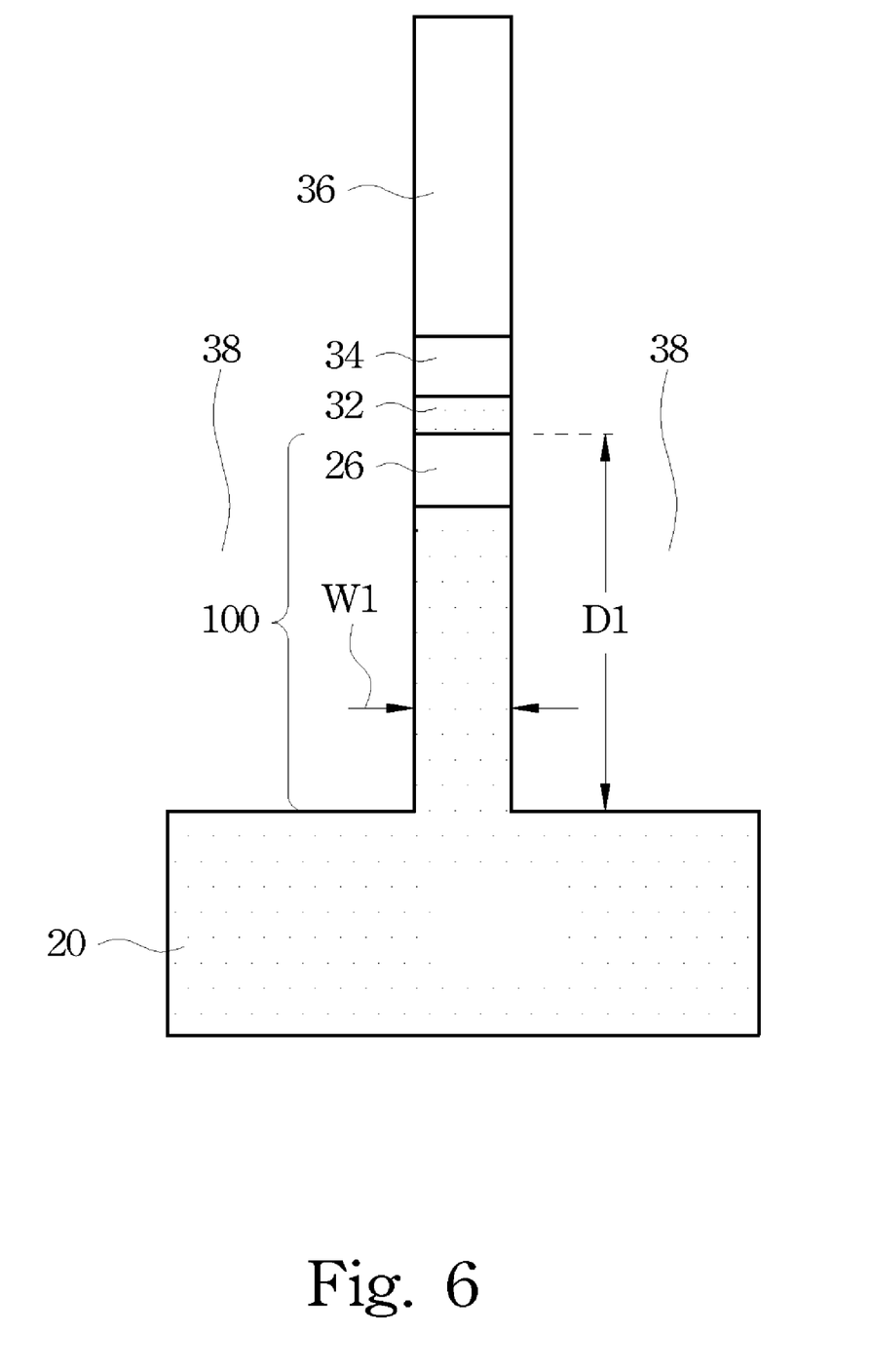

Referring to FIG. 6, photoresist 36 is formed on mask layer 34, and is then patterned, forming openings 38 in photoresist 36. Mask layer 34 and pad layer 32 are then etched through openings 38, exposing underlying condensed SiGe layer 26. Next, the condensed SiGe layer 26 and silicon substrate 20 are etched, so that openings 38 extend into condensed SiGe layer 26 and silicon substrate 20. Photoresist 36 is then removed. In an exemplary embodiment, the recessing depth D1 is between about 100 nm and about 300 nm. As a result of the recessing, fin 100, which includes a silicon fin and a condensed SiGe fin on the silicon fin, is formed. The width W1 of fin 100 may be between about 10 nm and about 80 nm, although greater or smaller widths may be used, depending on the preferred width of the germanium fin, as will be discussed in subsequent paragraphs.

Figure 7:
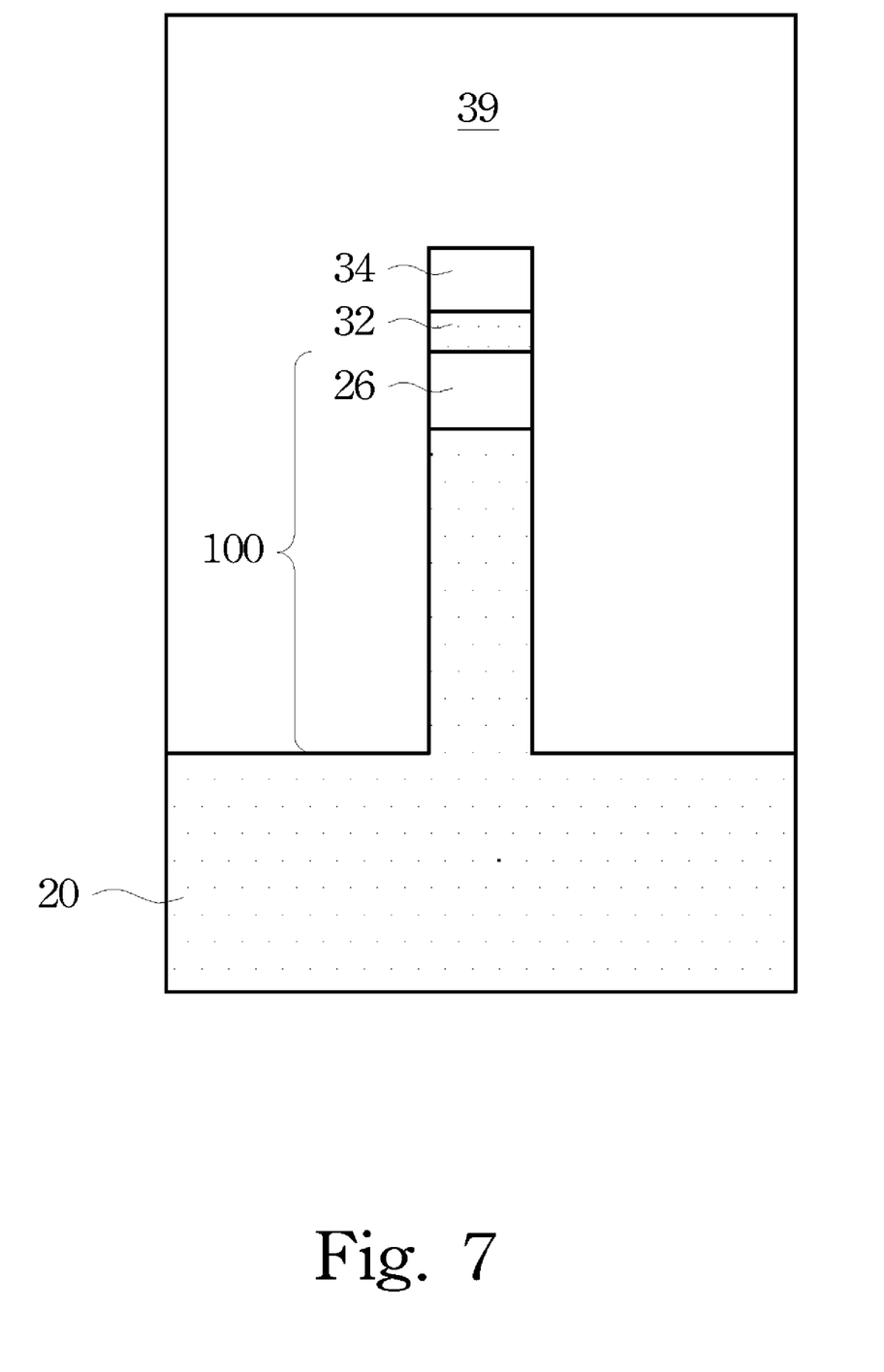
Figure 8:
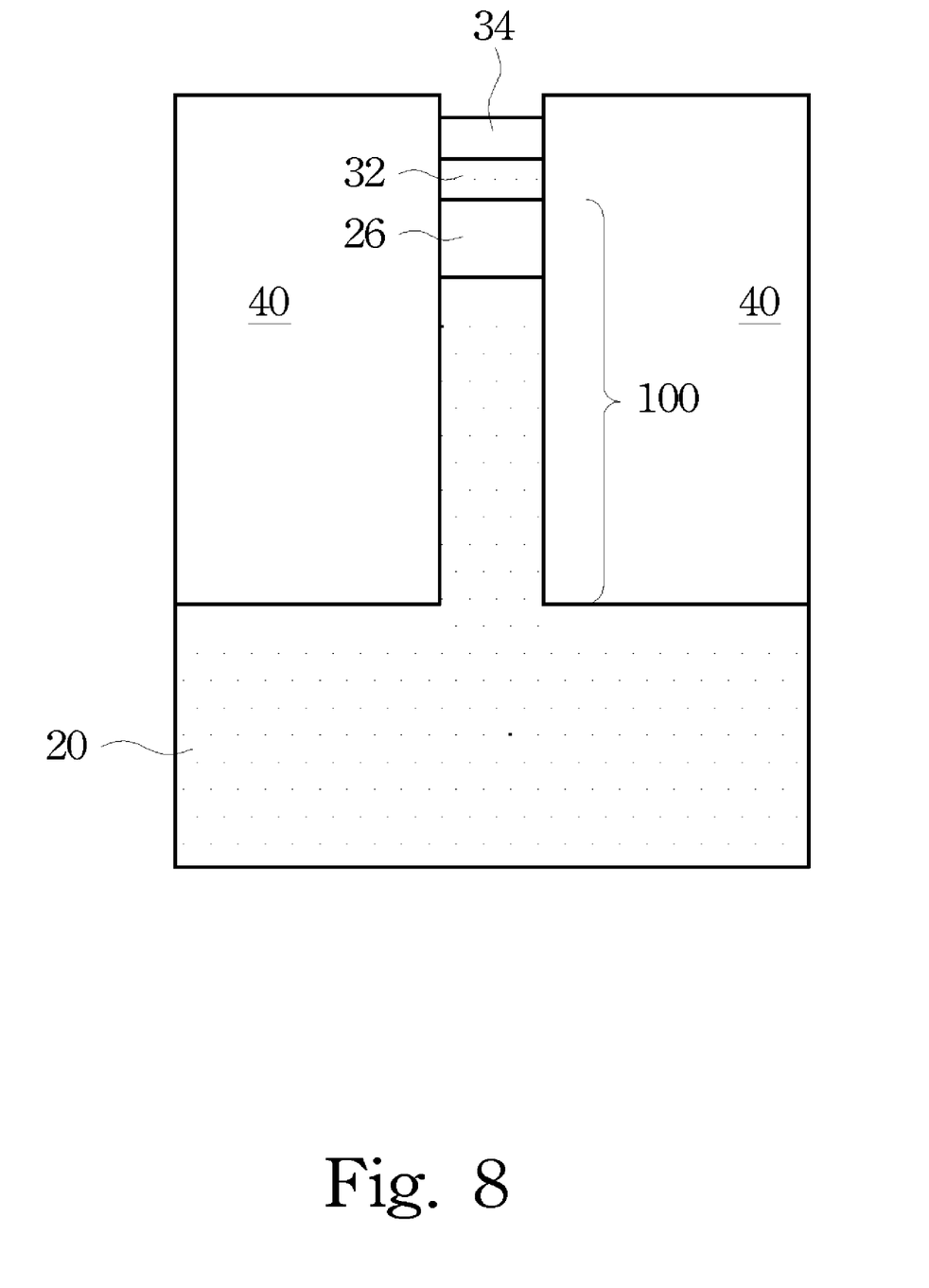

In the preferred embodiment, as shown in FIG. 7, openings 38 (shown in FIG. 6) are filled with dielectric material 39, preferably silicon oxide formed by sub-atmospheric chemical vapor deposition (SA-CVD). In other embodiments, dielectric material 39 is formed using high-density plasma chemical vapor deposition (HDP-CVD) or spin-on-glass (SOG). A chemical mechanical polish (CMP) is then performed to planarize the surface of the wafer, forming shallow trench isolation (STI) regions 40, and the resulting structure is shown in FIG. 8. Mask layer 34 may be used as a CMP stop layer.

Figure 9:
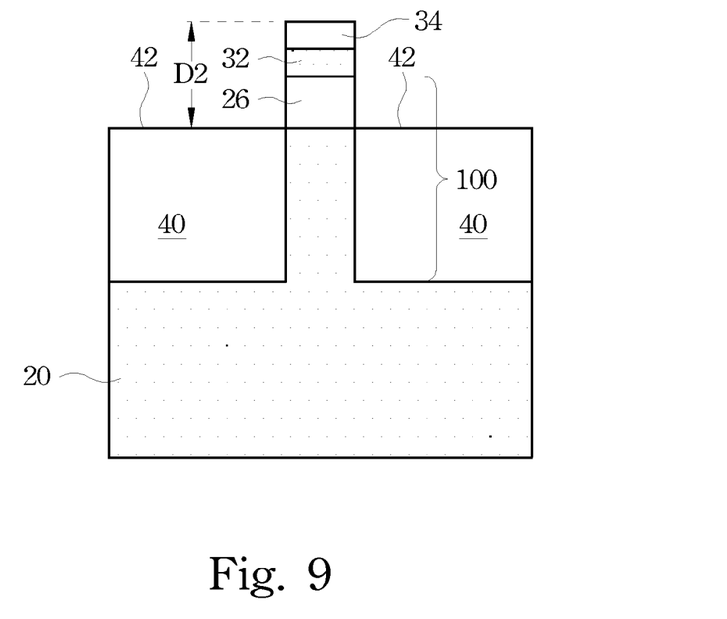

Referring to FIG. 9, the exposed STI regions 40 are recessed. The recessing distance D2 is related to the thickness of the condensed SiGe layer 26. After the recessing, the top surface 42 of STI regions 40 may be level with, or lower than, the interface between SiGe layer 26 and the silicon fin portion in fin 100. Next, an annealing is performed in a hydrogen environment.

Figure 10:
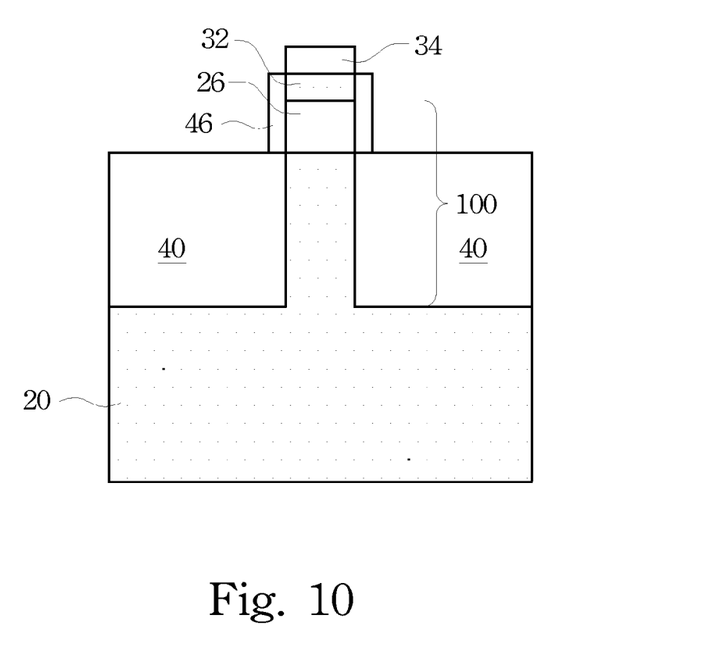
Figure 11:
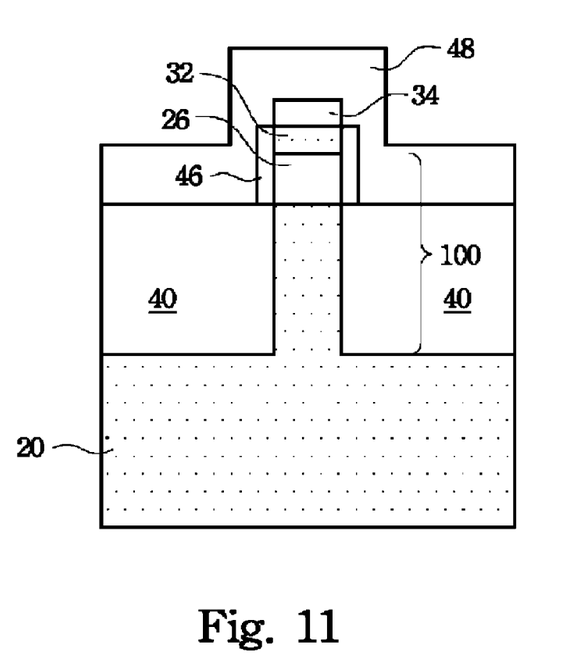

In FIG. 10, an oxidation is performed, and buffer oxide 46 (silicon oxide) is formed on sidewalls of fin 100. Buffer oxide 46 may have a thickness of between about 2 nm and about 6 nm. Next, as shown in FIG. 11, hard mask 48 is formed, which may also be formed of silicon nitride. In an exemplary embodiment, hard mask 48 has a thickness of between about 10 nm and about 50 nm. The exemplary formation methods include LPCVD, PECVD, and the like. The formation temperature may be between about 400° C. and about 900° C.

Figure 12:
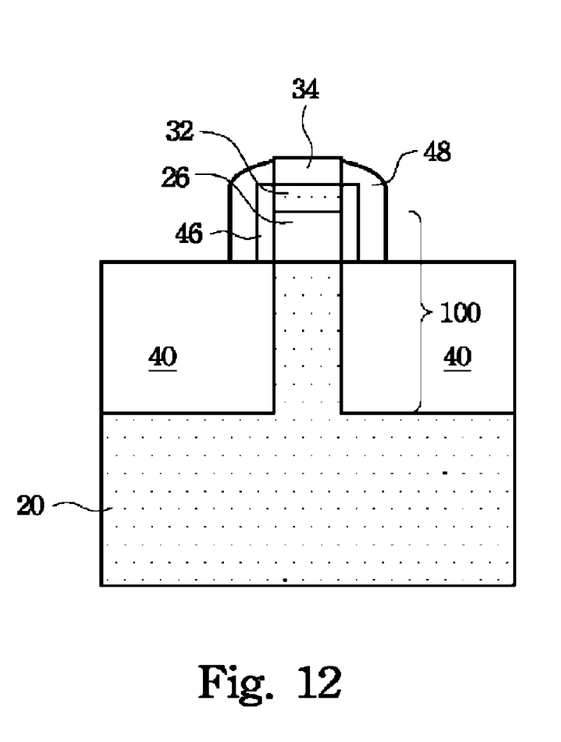
Figure 13:
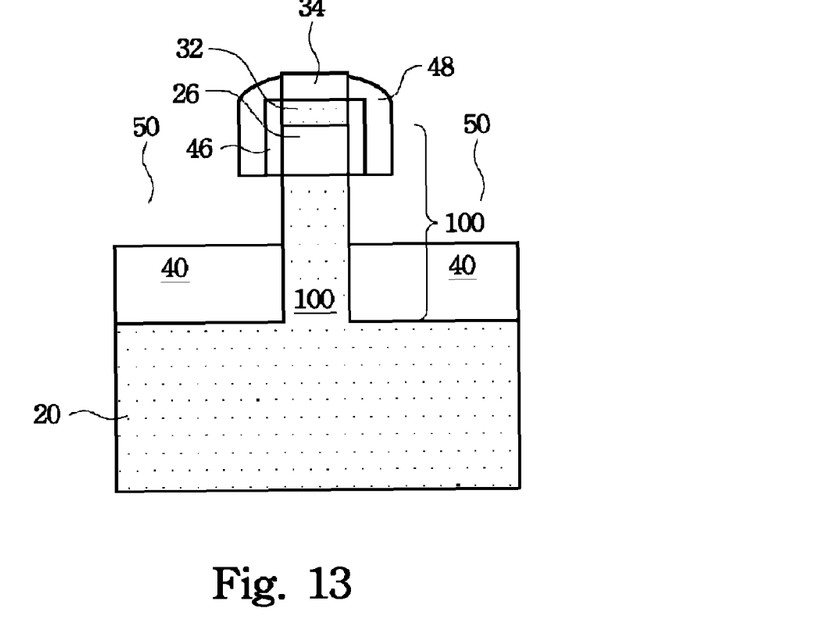

Next, as shown in FIG. 12, a dry etch is performed to remove horizontal portions of hard mask 48. At least some vertical portions of hard mask 48 remain un-etched. STI regions 40 are exposed through the remaining portions of hard mask 48. Referring to FIG. 13, an isotropic etch, which is preferably a wet etch, is performed. The remaining portions of hard mask 48 are substantially un-etched. Due to the isotropic etch, recesses 50 extend under the remaining portion of hard mask 48, and the sidewalls of the silicon fin in fin 100 are exposed.

Figure 14:
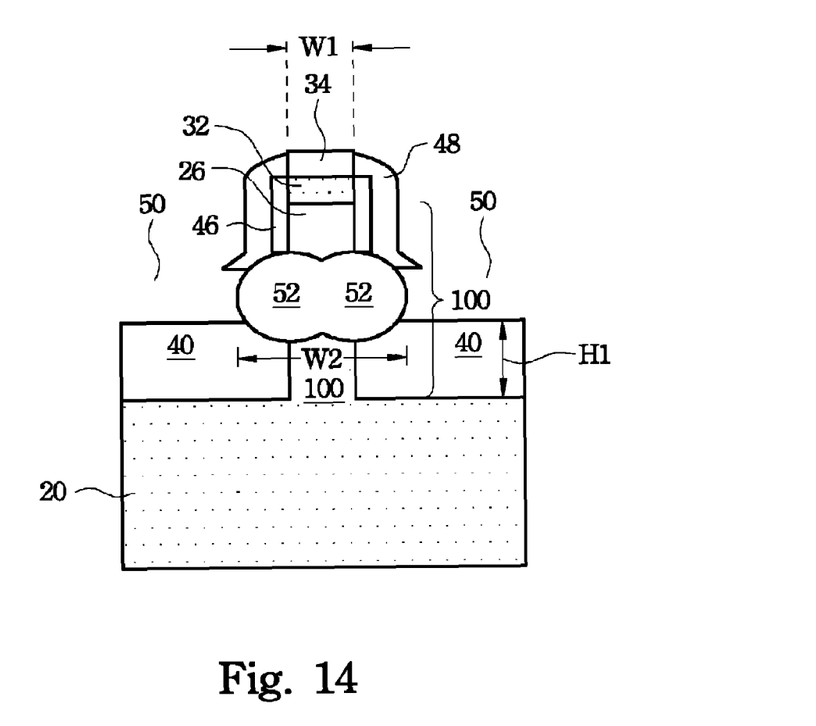

In FIG. 14, a further oxidation is performed, and the exposed portion of fin 100 is oxidized, forming oxide regions 52. It is noted that oxide regions 52 may comprise similar, or different materials than, the materials of STI regions 40. It is desirable that the oxidation only occurs in the silicon fin portion of fin 100, but not in the SiGe portion. Preferably, oxide regions 52 formed on opposing sides of fin 100 join each other, so that the upper portion of fin 100 including the SiGe portion is fully isolated from silicon substrate 20. Alternatively, oxide regions 52 formed on opposing sides of fin 100 don't join each other, and hence oxide regions 52 substantially fully, although not completely, isolate the upper portion of fin 100 from silicon substrate 20. Due to the volume increase in the oxidation, width W2 of the resulting oxide regions 52 may be between about two times to three times width W1 of fin 100. It is realized width W2 depends on the amount of oxygen in oxide regions 52, and the process conditions of the oxidation. An exemplary ratio of height H1 of STI regions 40 to height H2 of oxide regions 52 is between about 1.4 and 30. Oxide regions 52 are also referred to as punch-through stoppers due to their function in stopping the punch-through currents of the FinFET devices.

It is likely that the bottom portion of fin 100 as shown in FIG. 14 remains un-oxidized. Advantageously, even if the top surface of STI regions 40 surrounding fin 100 is lowered in subsequent cleaning processes, the fin height (which is independent from the level of the top surface of STI regions 40) is fixed, and is not a function of the level of the top surface of STI regions 40, resulting in more stable performance of the resulting FinFET.

Figure 15:
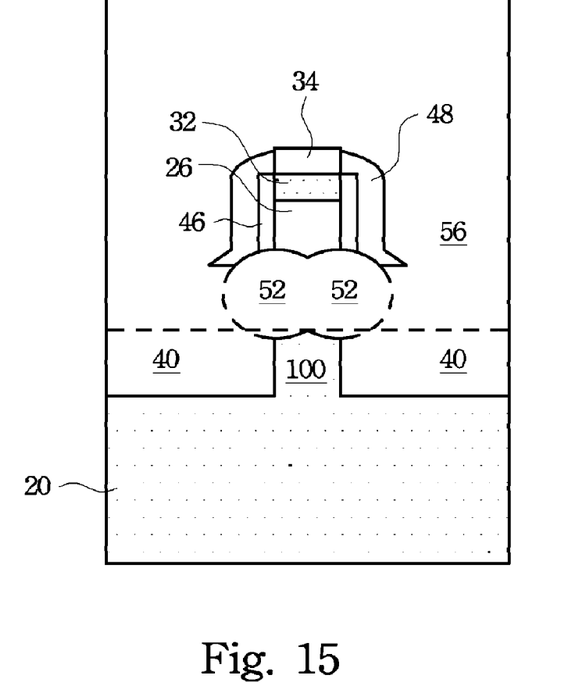
Figure 16:
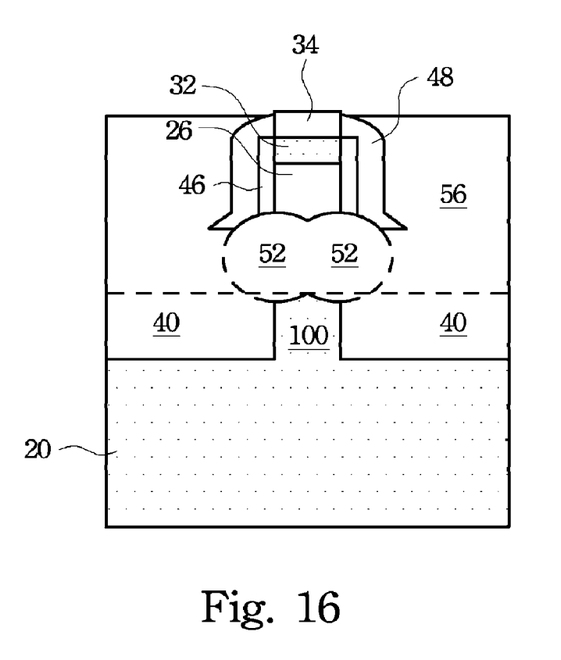

Referring to FIG. 15, oxide 56 is filled into recesses 50, until the top surface of oxide 56 is higher than the top surface of hard mask 34. In the preferred embodiment, spin-on-glass (SOG) oxide is used for its good gap-filling ability, although oxide 56 may also be formed using other methods with a good gap-filling ability, such as sub-atmospheric chemical vapor deposition (SACVD), and even HDPCVD. A CMP is then performed to remove excess oxide 56, until hard mask 34/48 is exposed, wherein hard mask 34/48 is used as a CMP stop layer. The resulting structure is shown in FIG. 16.

Figure 17:
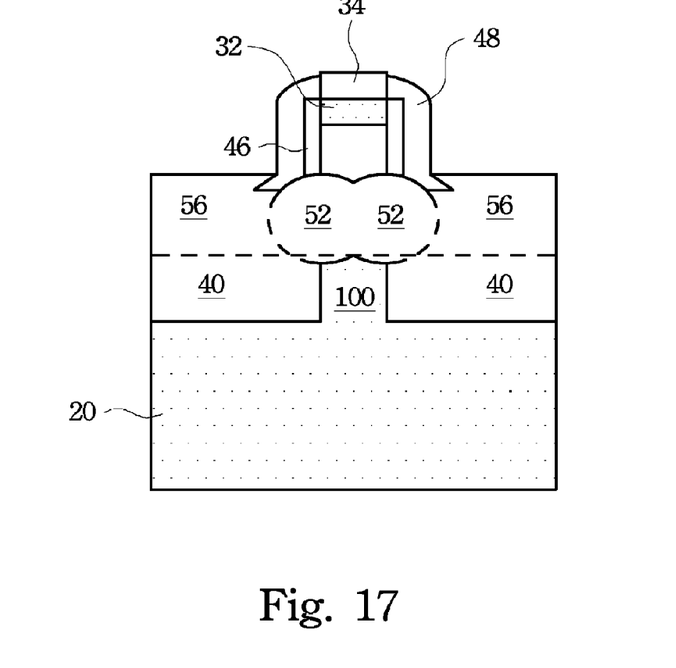
Figure 18:
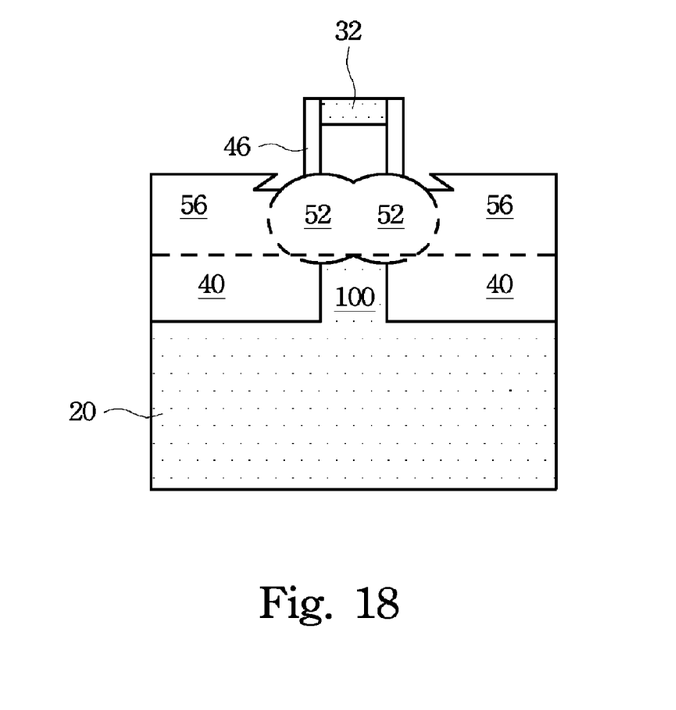

In FIG. 17, an etching is performed to recess oxide 56. Preferably, the etching stops at a position leveled with the top surface of oxide regions 52, or any position over the top surface of oxide regions 52 by less than about 20 nm. In FIG. 18, the remaining hard masks 34 and 48 are removed.

Figure 19:
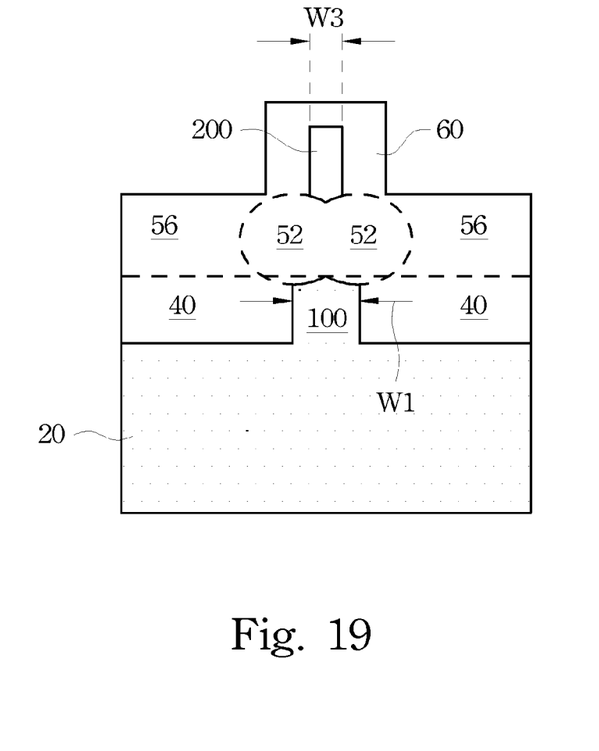
Figure 20:
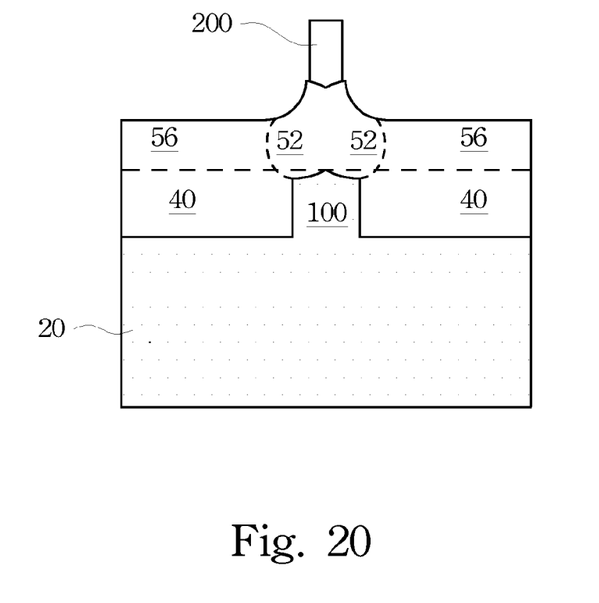

FIG. 19 illustrates a three-dimensional (3D) condensation, which is so named because the condensation may occur from the top and the sidewalls of fin 100. Preferably, the 3D condensation is preformed at a temperature between about 825° C. and 880° C. The 3D condensation results in silicon atoms to move outwardly, and hence forming silicon oxide layer 60. The top portion of the original fin 100, which includes condensed SiGe, is further condensed to form substantially pure germanium fin 200, wherein width W3 of fin 200 is smaller than width W1 of the remaining portion of fin 100. Further, germanium fin 200 vertically overlaps only a center portion of silicon fin 100, with silicon fin 100 extending beyond the edges of germanium fin 200 in all lateral directions. Due to the nature of the 3D condensation, the bottom surface of pure germanium fin 200 may not be flat. The germanium atomic percentage in germanium fin 200 may be higher than about 90 percent, and may be as high as about 100 percent (pure germanium). Buffer oxide 46 and silicon oxide layer 60 are then removed, as shown in FIG. 20. In the resulting structure, dielectric regions 40, 52 and 56 join each other to form one combined insulator, wherein the combined insulator region includes a first portion (portions of oxide regions 52) directly over fin 100, and second portions (including STI regions 40 and oxide regions 56) on opposite sides of fin 100, wherein the second portions may have bottoms lower than the bottom of the first portion.

Figure 21:
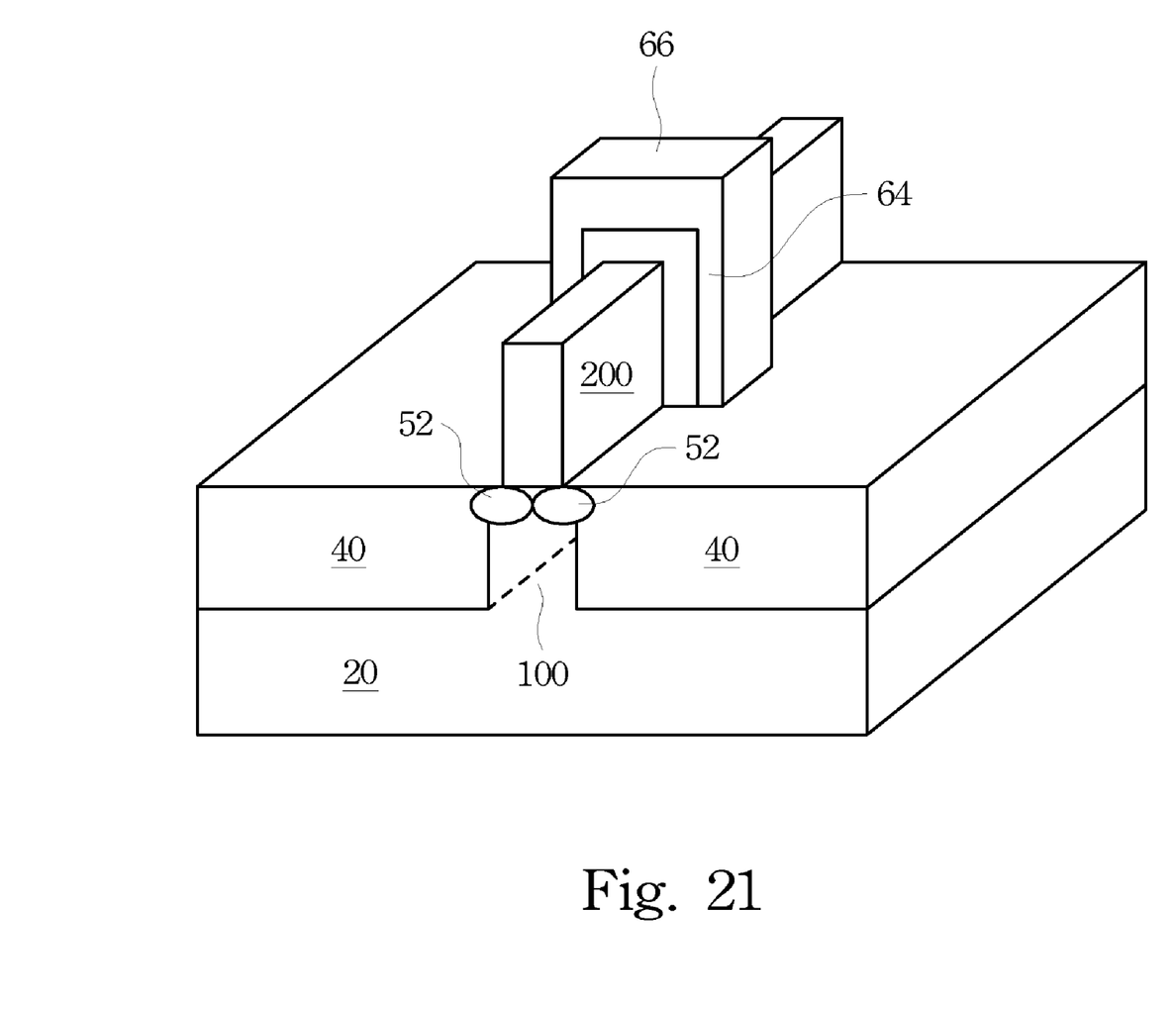
FIG. 21 illustrates a perspective view of a FinFET manufactured using the steps shown in FIGS. 1, 2 and 4-20.

Next, a gate stack including gate dielectric 64 and gate electrode 66 may be formed to form a FinFET, as is shown in FIG. 21, which is a perspective view. As is known in the art, the gate stacks may be formed using gate-first approaches or gate-last approaches. The processes for forming gate stacks using the gate-first or gate-last approaches have been discussed in U.S. patent application Ser. No. 12/116,074, which is incorporated herein by reference, and hence are not discussed herein.

The embodiments of the present invention have several advantageous features. Germanium nano-wires and the resulting FinFETs may be formed without the use of expensive germanium-on-insulator (GOI) or SiGe-on-insulator substrates. Due to the higher electron mobility and hole mobility of germanium, the drive currents of the FinFETs may be improved. The FinFETs formed using the embodiments of the present invention have reduced, and possibly have substantially eliminated, punch-through currents due to the formation of punch-through stoppers, which fully isolate source and drain regions of the FinFETs from the possible punch-through current paths. In addition, the channel regions do not require high impurity (well) concentrations, and the fin heights do not vary with the variation in the position of the top surface of STI regions. This results in a smaller variation in the FinFET performance.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   providing a composite substrate comprising a bulk silicon substrate and a silicon germanium (SiGe) layer over and adjoining the bulk silicon substrate;
   performing a first condensation to the SiGe layer to form a condensed SiGe layer, wherein the condensed SiGe layer has a substantially uniform germanium concentration;
   etching the condensed SiGe layer and a top portion of the bulk silicon substrate to form a composite fin, wherein the composite fin comprises a silicon fin and a condensed SiGe fin over the silicon fin;
   oxidizing a portion of the silicon fin, wherein the step of oxidizing comprises:
      filling a dielectric material to embed a bottom portion of the silicon fin therein;
      forming a mask to cover a top surface and sidewalls of the condensed SiGe fin, wherein the portion of the silicon fin is exposed; and
      performing an oxidation to oxidize the portion of the silicon fin and to form an oxide region; and
   performing a second condensation to the condensed SiGe fin.

2. The method of claim 1, wherein the first condensation is performed at a temperature between about 825° C. and about 880° C.

3. The method of claim 1, wherein the second condensation is performed at a temperature between about 825° C. and about 880° C.

4. The method of claim 1, wherein the first condensation converts substantially an entirety of the SiGe layer into the condensed SiGe layer.

5. The method of claim 1 further comprising, before the step of performing the second condensation, forming an additional dielectric material to a height substantially level with a top surface of the oxide region.

6. The method of claim 1 further comprising:
   before the step of performing the second condensation, forming an oxide layer to cover the condensed SiGe fin;
   after the step of performing the second condensation, removing the oxide layer and an additional oxide layer formed by the second condensation;
   forming a gate dielectric over the condensed SiGe fin; and
   forming a gate electrode over the gate dielectric.

7. The method of claim 1, wherein the step of performing the second condensation to the condensed SiGe fin is performed after the step of oxidizing the portion of the silicon fin.

8. A method of forming a semiconductor structure, the method comprising:
   providing a bulk silicon substrate;
   epitaxially growing a silicon germanium (SiGe) layer on the bulk silicon substrate;
   performing a first condensation to the SiGe layer to form a condensed SiGe layer at a temperature between about 825° C. and about 880° C.;
   etching the condensed SiGe layer and a top portion of the bulk silicon substrate to form a composite fin, wherein the composite fin comprises a silicon fin and a condensed SiGe fin over the silicon fin;
   oxidizing an upper portion of the silicon fin, wherein the condensed SiGe fin is not oxidized; and
   performing a second condensation to the condensed SiGe fin to form a substantially pure germanium fin.

9. The method of claim 8, wherein the first condensation is performed until an entirety of the SiGe layer is condensed and an entirety of the condensed SiGe layer has a substantially uniform atomic percentage.

10. The method of claim 8 further comprising, before the step of performing the first condensation, forming a cap layer on the SiGe layer.

11. A method of forming a semiconductor structure, the method comprising:
- providing a bulk silicon substrate;
- epitaxially growing a silicon germanium (SiGe) layer on the bulk silicon substrate;
- performing a first condensation to the SiGe layer to form a condensed SiGe layer, wherein the first condensation is performed at an elevated temperature;
- etching the condensed SiGe layer and a top portion of the bulk silicon substrate to form a recess and a composite fin in the recess, wherein the composite fin comprises a silicon fin and a condensed SiGe fin over the silicon fin;
- filling a first dielectric material into the recess;
- etching the first dielectric material until the condensed SiGe fin is exposed;
- forming a mask to cover a top surface and sidewalls of the condensed SiGe fin;
- recessing the first dielectric material to expose sidewalls of a portion of the silicon fin;
- oxidizing the portion of the silicon fin to form an insulator;
- filling a second dielectric material on the first dielectric material, wherein a top surface of the second dielectric material is substantially level with a top surface of the insulator; and
- performing a second condensation to the condensed SiGe fin to form a substantially pure germanium fin.

12. The method of claim 11, wherein, after the step of oxidizing the portion of the silicon fin, a lower portion of the silicon fin is not oxidized.

13. The method of claim 11, wherein the elevated temperature comprises a temperature between about 825° C. and about 880° C.

14. The method of claim 11, wherein the step of performing the second condensation is performed at a temperature between about 825° C. and about 880° C.

15. The method of claim 11, wherein the insulator penetrates from one side edge of the silicon fin to an opposite side edge of the silicon fin.

16. The method of claim 11, wherein, after the step of recessing the first dielectric material to expose the sidewalls of the portion of the silicon fin, a top surface of the first dielectric material is no higher than a bottom surface of the condensed SiGe fin.

17. The method of claim 11, wherein the substantially pure germanium fin has a germanium atomic percentage of greater than about 90 percent.

* * * * *